(12) United States Patent
Chung

(10) Patent No.: US 6,998,882 B1
(45) Date of Patent: Feb. 14, 2006

(54) FREQUENCY DIVIDER WITH 50% DUTY CYCLE

(75) Inventor: Chi-Jui Chung, Kao-Hsiung (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 10/711,839

(22) Filed: Oct. 8, 2004

(51) Int. Cl.
*H03K 21/00* (2006.01)
(52) U.S. Cl. .......................... 327/115; 377/47
(58) Field of Classification Search ........ 327/113–118, 327/39, 44, 47, 49
See application file for complete search history.

(56) References Cited

U.S. PATENT DOCUMENTS

| | | | | |
|---|---|---|---|---|
| 5,410,683 A | * | 4/1995 | Al-Khairi | 713/501 |
| 5,524,035 A | * | 6/1996 | Casal et al. | 377/47 |
| 6,097,782 A | * | 8/2000 | Foroudi | 377/47 |
| 6,618,462 B1 | * | 9/2003 | Ross et al. | 377/48 |

* cited by examiner

*Primary Examiner*—Dinh T. Le
(74) *Attorney, Agent, or Firm*—Winston Hsu

(57) ABSTRACT

A frequency divider with a 50% duty cycle. The present invention includes a divider, a counter, a first comparator, a second comparator, a first flip-flop, an AND gate, a second flip-flip, and an OR gate for generating odd divided frequencies and even divided frequencies having 50% duty cycles using a single circuit.

5 Claims, 4 Drawing Sheets

| $J_n$ | $K_n$ | $Q_n$ |
|---|---|---|
| 0 | 0 | $Q_{n-1}$ |
| 0 | 1 | 1 |
| 1 | 0 | 0 |
| 1 | 1 | $\overline{Q_{n-1}}$ |

Fig. 5

| $CK_n$ | $D_n$ | $Q_n$ |
|---|---|---|
| 0 | ? | $Q_{n-1}$ |
| 1 | 1 | 1 |
| 1 | 0 | 0 |

Fig. 6

FREQUENCY DIVIDER WITH 50% DUTY CYCLE

BACKGROUND OF INVENTION

1. Field of the Invention

The present invention provides a frequency divider, and more particularly, a frequency divider for generating odd-number and even-number divided frequencies with a 50% duty cycle.

2. Description of the Prior Art

Digital integrated circuits have been highly developed. Personal computers, mobile phones, digital watches, and calculators, for example, are applications of digital integrated circuits. A complex digital integrated circuit often includes a plurality of divided frequencies used to enable each device in the circuit to operate properly. For example, because a CPU and a RAM operate using different clocks, a computer system should provide different divided frequencies for the CPU and the RAM to keep synchronization.

Please refer to FIG. 1, which illustrates a schematic diagram of a prior art frequency divider 10. The frequency divider 10 includes a comparator 12 and a counter 14. The comparator 12 compares a dividing number n with a count of the counter 14. When the dividing number n equals the count of the counter 14, the comparator 12 outputs a high-level square wave. The counter 14 outputs a sequence of counts according to rising edges of a reference frequency $F_{ref}$, and is reset by the high-level square wave of the comparator 12, so as to output a sequence of count cycles $S_{cn}$. Therefore, the frequency divider 10 can output a one-n'th frequency $F_{cn}$ with a closed loop formed by the comparator 12 and the counter 14. For example, when outputting a one-second frequency $F_{c2}$, the frequency divider 10 sets the sequence of count cycles $S_{cn}$ of the counter 14 to be two counts for one cycle. As to operations of the frequency divider 10 when outputting one-second frequency $F_{c2}$, please refer to FIG. 2, which illustrates a waveform diagram versus time sequence. In FIG. 2, a count cycle Sc2 represents the two-count cycle provided by the counter 14. As mentioned above, the counter 14 is triggered by the rising edges of the reference frequency $F_{ref}$, so when the count of the counter 14 is 2, the comparator 12 outputs a high-level signal. Meanwhile, the counter 14 is reset with the high-level square waves provided by the comparator 12 for counting from 1 again. As a result, the frequency divider 10 can output the one-second frequency $F_{c2}$ with a 50% duty cycle from the comparator 12.

However, when outputting a one-n'th frequency with an odd number n (such as 1/3, 1/5, and 1/7 frequencies), the output frequency $F_{cn}$ of the prior art frequency divider 10 has asymmetric duty cycles. Please refer to FIG. 3, which illustrates a waveform diagram of the prior art frequency divider 10 when outputting a one-third frequency $F_{c3}$. As mentioned above, the counter 14 is triggered with the rising edges of the reference frequency $F_{ref}$ so that when the count of the counter 14 is 3, the comparator 12 outputs a high-level signal. Meanwhile, the counter 14 is reset with the high-level square waves provided by the comparator 12 for counting from 1 again. As a result, the frequency divider 10 outputs the one-third frequency $F_{c3}$ from the comparator 12 with about a 33% duty cycle, as shown in FIG. 3.

For those systems operated in low frequency bands, as long as all devices in the systems are triggered with either rising edges of the frequency $F_{cn}$ or falling edges of the frequency $F_{cn}$, the asymmetric frequency $F_{cn}$ of the prior art frequency divider 10 does not affect the systems. However, in high-frequency or high-speed applications, some devices in a system are triggered with the rising edges of the frequency $F_{cn}$, and the other are triggered with the falling edges, so the asymmetry of the frequency $F_{cn}$ will cause a serious problem in system synchronization. Although the frequency divider 10 can properly output 1/n frequencies having 50% duty cycles with even numbers n as shown in FIG. 2, the frequency divider 10 should output 1/n frequencies with odd numbers n to a duty-cycle recovery unit for converting the asymmetric duty cycles to be symmetric duty cycles. Therefore, when a system needs both odd-number and even-number divided frequencies, the system should include an even-number frequency divider and an odd-number frequency divider with a duty-cycle recovery unit. However, owing to circuit limitations (such as inconsistence or noise), the duty-cycle of the odd-number frequency divider cannot completely convert asymmetries to symmetries. In short, the prior art frequency divider cannot output both even-number and odd-number divided frequencies using the same circuitry.

SUMMARY OF INVENTION

It is therefore a primary objective of the claimed invention to provide a frequency divider with a 50% duty cycle.

According to the claimed invention, a frequency divider with a 50% duty cycle includes: a bit shifter for outputting a first quotient, a second quotient and a remainder of the second quotient according to a dividing number; a counter for counting according to a reference frequency; a first comparator coupled to the bit shifter and the counter for outputting a first comparison result according to the first quotient and counts of the counter; a second comparator coupled to the bit shifter and the counter for outputting a second comparison result according to the second quotient and counts of the counter; a first flip flop coupled to the first comparator and the second comparator for outputting a first result according to the reference frequency, the first comparison result, and the second comparison result; an AND gate coupled to the bit shifter and the first flip flop for outputting an AND result according to the remainder of the second quotient and the first comparison result; a second flip flop coupled to the AND gate for outputting a second result according to the AND result and the reference frequency; and an OR gate coupled to the first flip flop and the second flip flop for outputting a frequency according to the first result and the second result.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

FIG. 5 illustrates a truth table of a JK flip flop.

FIG. 6 illustrates a truth table of a D flip flop.

DETAILED DESCRIPTION

Figure 1:
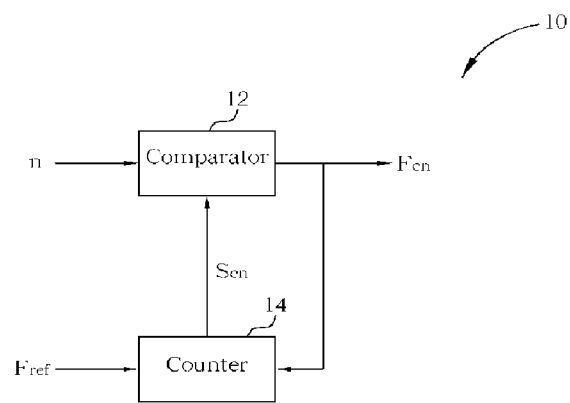
FIG. 1 illustrates a schematic diagram of a prior art frequency divider.
Figure 2:
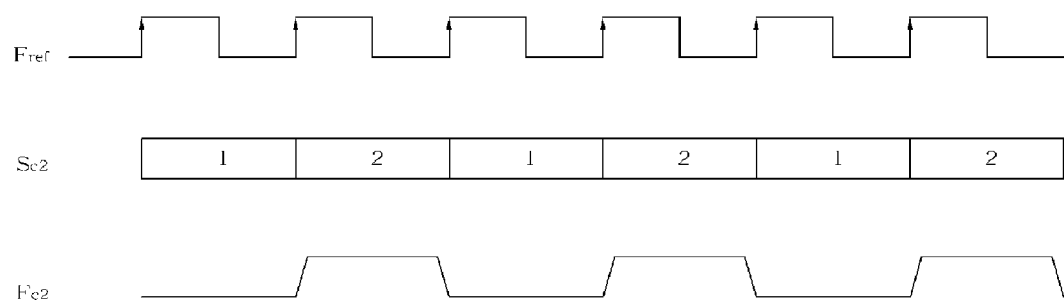
FIG. 2 and FIG. 3 illustrate waveform diagrams versus time when the frequency divider in FIG. 1 outputs 1/2 and 1/3 frequencies.
Figure 3:
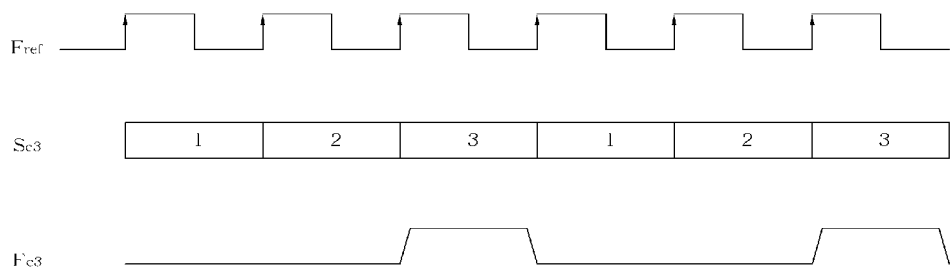
Figure 4:
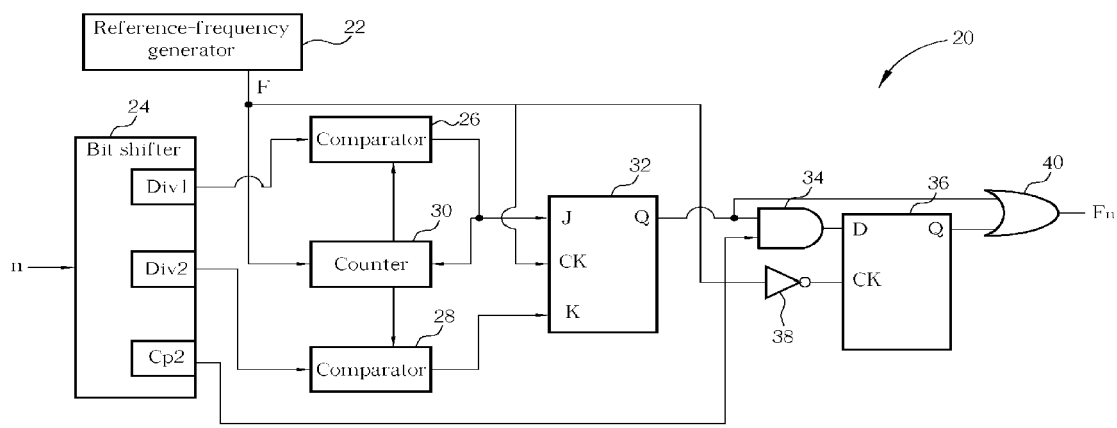
FIG. 4 illustrates a schematic diagram of a frequency divider with a 50% duty cycle.

Please refer to FIG. 4, which illustrates a schematic diagram of a frequency divider 20 with a 50% duty cycle in accordance with the present invention. The frequency divider 20 includes a reference-frequency generator 22, a bit shifter 24, comparators 26 and 28, a counter 30, a JK flip flop 32, an AND gate 34, a D flip flop 36, an inverter (NOT gate) 38, and an OR gate 40. The reference-frequency generator 22 generates a reference frequency F for the counter 30, a terminal CK of the JK flip flop 32, and the inverter 38. The inverter 38 inverts the received reference frequency F to a terminal CK of the D flip flop 36. The bit shifter 24 outputs a dividing number n from a terminal Div1 to the comparator 26, a quotient of the dividing number n divided by 2 from a terminal Div2 to the comparator 28, and a remainder of the dividing number n divided by 2 from a terminal Cp2 to the AND gate 34. The counter 30 triggered by rising edges of the reference frequency F outputs counts starting from 1 to the comparator 26 and 28. The comparator 26 can compare the counts of the counter 30 with the dividing number n provided by the bit shifter 24. When a count of the counter 30 equals the dividing number n of the bit shifter 24, the comparator 26 outputs high-level signals to a terminal J of the JK flip flop 32 and the counter 30 for resetting the counter 30. By the same token, the comparator 26 can compare the counts of the counter 30 with the quotient of the dividing number n divided by 2 provided by the bit shifter 24. When a count of the counter 30 equals the quotient of the dividing number n divided by 2, the comparator 28 outputs high-level signals to a terminal K of the JK flip flop 32. Please refer to FIG. 5, which illustrates a truth table of the JK flip flop 32. In FIG. 5, "1" represents high-level signals, "0" represents low-level signals, $J_n$ and $K_n$ represent levels of signals received in the terminals J, K of the JK flip flop 32, $Q_n$ represents a level of a signal outputted from a terminal Q of the JK flip flop 32, and $Q_{n-1}$ represents the former status of signal levels outputted from the terminal Q. Therefore, according to the truth table in FIG. 5, when an output signal of the comparator 26 in FIG. 4 is low, and an output signal of the comparator 28 is high, the JK flip flop 32 outputs a high-level signal from the terminal Q, so the AND gate 34 performs an AND operation on the output signal of the terminal Q of the JK flip flop 32 and the remainder of the dividing number n divided by 2 provided by the terminal Cp2 of the bit shifter 24. Therefore, if both the remainder of the dividing number n divided by 2 and the output signal of the terminal Q of the JK flip flop 32 are 1, the AND gate 34 outputs a high-level signal to the D flip flop 36. Please refer to FIG. 6, which illustrates a truth table of the D flip flop 36. Similar to the notations used in FIG. 5, in FIG. 6, $CK_n$ and $D_n$ represent levels of input signals of the terminals CK and D of the D flip flop 36, while $Q_n$ represents a level of output signals of the terminal Q of the D flip flop 36. Therefore, according to the truth table in FIG. 6, if both the input signals of the terminals CK and D are high (when the reference frequency F is low, and when the output signal of the AND gate 34 is high), a high-level signal is outputted from the terminal Q of the D flip flop 36 to the OR gate 40. The OR gate 40 performs an OR operation on the output signals of the terminals Q of the D flip flop 36 and the JK flip flop 32, so as to output a 1/n frequency Fn of the reference frequency F.

Figure 7:
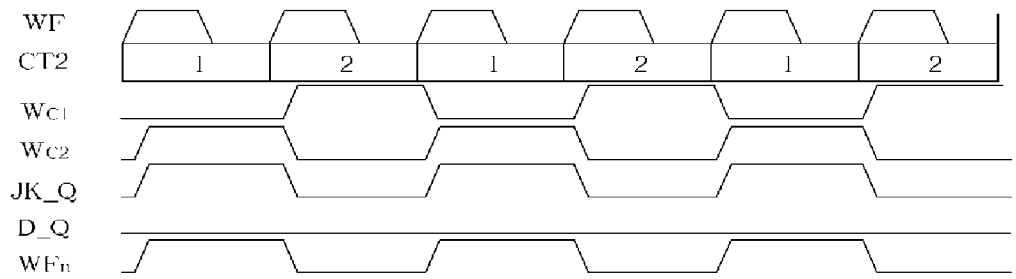
FIG. 7 and FIG. 8 illustrate waveform diagrams versus time when the frequency divider in FIG. 4 outputs a 1/2 and a 1/3 frequencies.

Take a 1/2 frequency F2 for example, when outputting the 1/2 frequency F2, the present invention frequency divider 20 with the 50% duty cycle sets the dividing number n equal to 2 first. Then, please refer to FIG. 7, which illustrates a waveform diagram versus time sequence of the frequency divider 20 when outputting the 1/2 frequency F2. In FIG. 7, a waveform WF represents a waveform of the reference frequency F provided by the reference-frequency generator 22, a count CT2 represents the counts provided by the counter 30, waveforms $W_{c1}$ and $W_{c2}$ represent waveforms of output signals provided by the comparator 26 and 28, a waveform JK_Q represents a waveform of an output signal provided by the terminal Q of the JK flip flop 32, a waveform D_Q represents a waveform of an output signal provided by the terminal Q of the D flip flop 36, and a waveform $WF_n$ represents a waveform of an output signal provided by the OR gate 40. As mentioned above, when outputting the 1/2 frequency F2, the present invention frequency divider 20 sets the dividing number n=2 for the bit shifter 24. The bit shifter 24 outputs the dividing number 2 to the comparator 26, the quotient (=1) of the dividing number 2 divided by 2 to the comparator 28, and the remainder (=0) of the dividing number 2 divided by 2 to the AND gate 34. The counter 30 triggered by the rising edges of the reference frequency F outputs the count CT2. The comparator 26 outputs high-level signals and the counter 30 is reset to count from 1 when the count CT2 equals the dividing number 2. Similarly, the comparator 28 outputs high-level signals when the count CT2 equals 1. Then, the truth table of the JK flip flop 32 in FIG. 5 is applied to the output signals of the comparator 26 and 28 for outputting the waveform JK_Q shown in FIG. 7 from the Q terminal of the JK flip flop 32. Because the remainder of the dividing number 2 divided by 2 is 0, the output signals of the AND gate 34 is also 0 regardless of whether the output signals of the terminal Q of the JK flip flop 32 is high or low. That is, the input signal of the terminal D of the D flip flop 36 is 0 all the time in this case. Therefore, according to the truth table of the D flip flop 36 in FIG. 6, the output signal of the terminal Q of the D flip flop 36 is low all the time (as the waveform D_Q shown in FIG. 7). Finally, the OR gate 40 performs the OR operation on the output signals of the terminals Q of the JK flip flop 32 and the D flip flop 36, so as to output the waveform $WF_n$. The cycle of the waveform $WF_n$ is two times the waveform WF, or the output signal of the OR gate 40 is the 1/2 frequency F2 of the reference frequency F with a 50% duty cycle.

Figure 8:
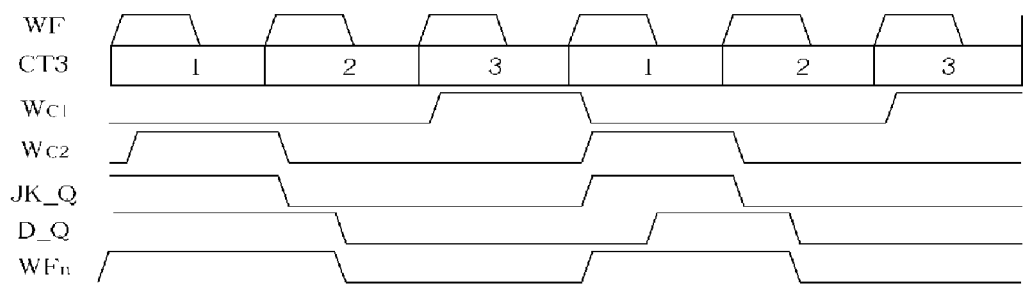

By the same token, please refer to FIG. 8, which illustrates a waveform diagram versus time sequence of the frequency divider 20 when outputting a 1/3 frequency F3. When outputting the 1/3 frequency F3, the frequency divider 20 sets the dividing number n equal to 3 for the bit shifter 24. The bit shifter 24 outputs the dividing number 3 to the comparator 26, the quotient (=1) of the dividing number 3 divided by 2 to the comparator 28, and the remainder (=1) of the dividing number 3 divided by 2 to the AND gate 34. The counter 30 triggered by the rising edges of the reference frequency F outputs the count CT3. The comparator 26 outputs high-level signals and the counter 30 is reset to count from 1 when the count CT3 equals the dividing number 3. Similarly, the comparator 28 outputs high-level signals when the count CT3 equals 1. Then, the truth table of the JK flip flop 32 in FIG. 5 is applied to the output signals of the comparator 26 and 28 for outputting the waveform JK_Q shown in FIG. 8 from the Q terminal of the JK flip flop 32. Because the remainder of the dividing number 3 divided by 2 is 1, the output signals of the AND gate 34 is high when the output signal of the terminal Q of the JK flip flop 32 is high. The D flip flop 36 is triggered by the rising edges of the input signal of the terminal CK, or by the falling edges of the reference frequency F (because the reference frequency F is inverted by the inverter 38 for the terminal CK of the D flip flop 36), so according to the truth table of the D flip flop 36 in FIG. 6, the output signal of the terminal Q of the D flip flop 36 is represented by the waveform D_Q shown in FIG. 8. Finally, the OR gate 40 performs the OR operation on the output signals of the terminals Q of the JK flip flop 32 and the D flip flop 36, so as to output the waveform $WF_n$. The cycle of the waveform $WF_n$ is three times the waveform WF, or the output signal of the OR gate 40 is the 1/3 frequency F3 of the reference frequency F with a 50% duty cycle.

In comparison, the present invention can output both odd-number and even number divided frequencies with the same circuit (as long as changing the dividing number n), and keep duty cycle symmetrical. Therefore, the present invention frequency divider with the 50% duty cycle improves problems of the prior art, and increases accuracy of the odd-number and even number divided frequencies, so as to maintain accurate operation of a system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency divider with a 50% duty cycle, comprising:
   a bit shifter for outputting a first quotient, a second quotient, and a remainder of the second quotient according to a dividing number;
   a counter for counting according to a reference frequency;
   a first comparator coupled to the bit shifter and the counter for outputting a first comparison result according to the first quotient and counts of the counter;
   a second comparator coupled to the bit shifter and the counter for outputting a second comparison result according to the second quotient and counts of the counter;
   a first flip flop coupled to the first comparator and the second comparator for outputting a first result according to the reference frequency, the first comparison result, and the second comparison result;
   an AND gate coupled to the bit shifter and the first flip flop for outputting an AND result according to the remainder of the second quotient and the first comparison result;
   a second flip flop coupled to the AND gate for outputting a second result according to the AND result and the reference frequency; and
   an OR gate coupled to the first flip flop and the second flip flop for outputting a frequency according to the first result and the second result.

2. The frequency divider of claim 1, further comprising a reference-frequency generator for outputting the reference frequency.

3. The frequency divider of claim 1, wherein the first flip flop is a JK flip flop.

4. The frequency divider of claim 1, wherein the second flip flop is a D flip flop.

5. The frequency divider of claim 1, wherein the second flip flop is triggered by falling edges of the reference frequency.

* * * * *